(12) United States Patent
Root et al.

(10) Patent No.: US 7,545,157 B2
(45) Date of Patent: Jun. 9, 2009

(54) SHIELDED PROBE APPARATUS FOR PROBING SEMICONDUCTOR WAFER

(75) Inventors: Bryan J. Root, Apple Valley, MN (US); William A. Funk, Eagan, MN (US)

(73) Assignee: Celadon Systems, Inc., Apple Valley, MN (US)

( * ) Notice: Subject to any disclaimer, the term of this patent is extended or adjusted under 35 U.S.C. 154(b) by 0 days.

(21) Appl. No.: 11/779,669

(22) Filed: Jul. 18, 2007

(65) Prior Publication Data

US 2007/0252606 A1 Nov. 1, 2007

Related U.S. Application Data

(60) Division of application No. 11/270,044, filed on Nov. 9, 2005, now Pat. No. 7,259,577, which is a continuation of application No. 10/607,768, filed on Jun. 27, 2003, now Pat. No. 6,992,495.

(60) Provisional application No. 60/392,394, filed on Jun. 28, 2002.

(51) Int. Cl.
*G01R 31/02* (2006.01)
(52) U.S. Cl. ................................. 324/754
(58) Field of Classification Search ............ 324/754, 324/761, 762, 760, 765, 158.1; 174/121 A, 174/106 R, 23 R; 439/169, 174, 482, 912
See application file for complete search history.

(56) References Cited

U.S. PATENT DOCUMENTS

| | | | |
|---|---|---|---|
| 3,787,768 A | 1/1974 | Kubota et al. | |
| 3,963,986 A | 6/1976 | Morton et al. | |
| 4,480,223 A * | 10/1984 | Aigo | 324/752 |
| 4,667,523 A | 5/1987 | Becker et al. | |
| 4,731,577 A | 3/1988 | Logan | |
| 4,845,426 A | 7/1989 | Nolan et al. | |
| 5,003,254 A | 3/1991 | Hunt et al. | |
| 5,015,947 A | 5/1991 | Chism | |
| 5,150,040 A | 9/1992 | Byrnes et al. | |
| 5,151,653 A | 9/1992 | Yutori et al. | |
| 5,168,218 A | 12/1992 | Rich | |
| 5,192,907 A | 3/1993 | Bonaria | |
| 5,325,052 A | 6/1994 | Yamashita | |
| 5,473,254 A | 12/1995 | Asar | |
| 5,488,292 A | 1/1996 | Tsuta | |
| 5,525,911 A | 6/1996 | Marumo et al. | |
| 5,729,150 A | 3/1998 | Schwindt | |
| 5,742,174 A | 4/1998 | Kister et al. | |
| 5,949,018 A * | 9/1999 | Esker | 174/23 R |

(Continued)

FOREIGN PATENT DOCUMENTS

EP 0 177 809 4/1986

(Continued)

*Primary Examiner*—Ha Tran T Nguyen
*Assistant Examiner*—Tung X Nguyen
(74) *Attorney, Agent, or Firm*—Hamre, Schumann, Mueller & Larson, P.C.

(57) ABSTRACT

A shielded probe apparatus is provided with a shielded probe and a tri-axial cable that are electrically connected within a shielded chassis. The shielded probe apparatus is capable of electrically testing a semiconductor device at a sub 100 fA operating current and an operating temperature up to 300 C.

11 Claims, 6 Drawing Sheets

U.S. PATENT DOCUMENTS

| | | |
|---|---|---|
| 5,952,843 A | 9/1999 | Vinh |
| 6,050,829 A | 4/2000 | Eldridge et al. |
| 6,075,376 A | 6/2000 | Schwindt |
| 6,124,723 A | 9/2000 | Costello |
| 6,137,302 A * | 10/2000 | Schwindt .................... 324/762 |
| 6,201,402 B1 | 3/2001 | Root |
| 6,275,051 B1 | 8/2001 | Bachelder et al. |
| 6,276,956 B1 | 8/2001 | Cook |
| 6,586,954 B2 | 7/2003 | Root |
| 6,603,322 B1 | 8/2003 | Boll et al. |
| 6,727,726 B1 | 4/2004 | Plants |
| 6,860,756 B2 * | 3/2005 | Chen ......................... 439/523 |
| 6,992,495 B2 | 1/2006 | Root et al. |
| 7,259,577 B2 | 8/2007 | Root et al. |
| 2001/0011902 A1 | 8/2001 | Scwindt |

FOREIGN PATENT DOCUMENTS

| | | |
|---|---|---|
| WO | WO 99/04273 | 1/1999 |

* cited by examiner

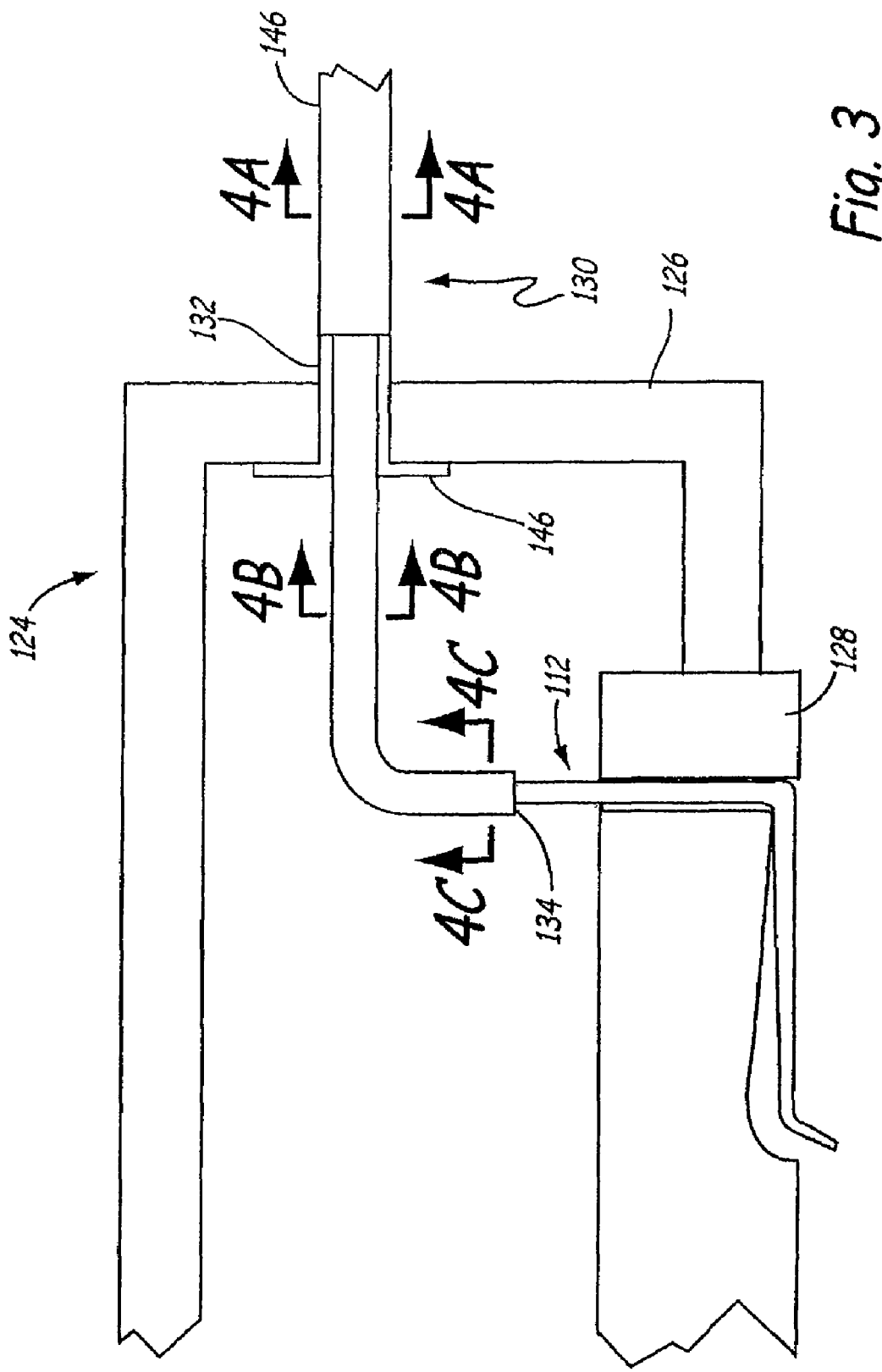

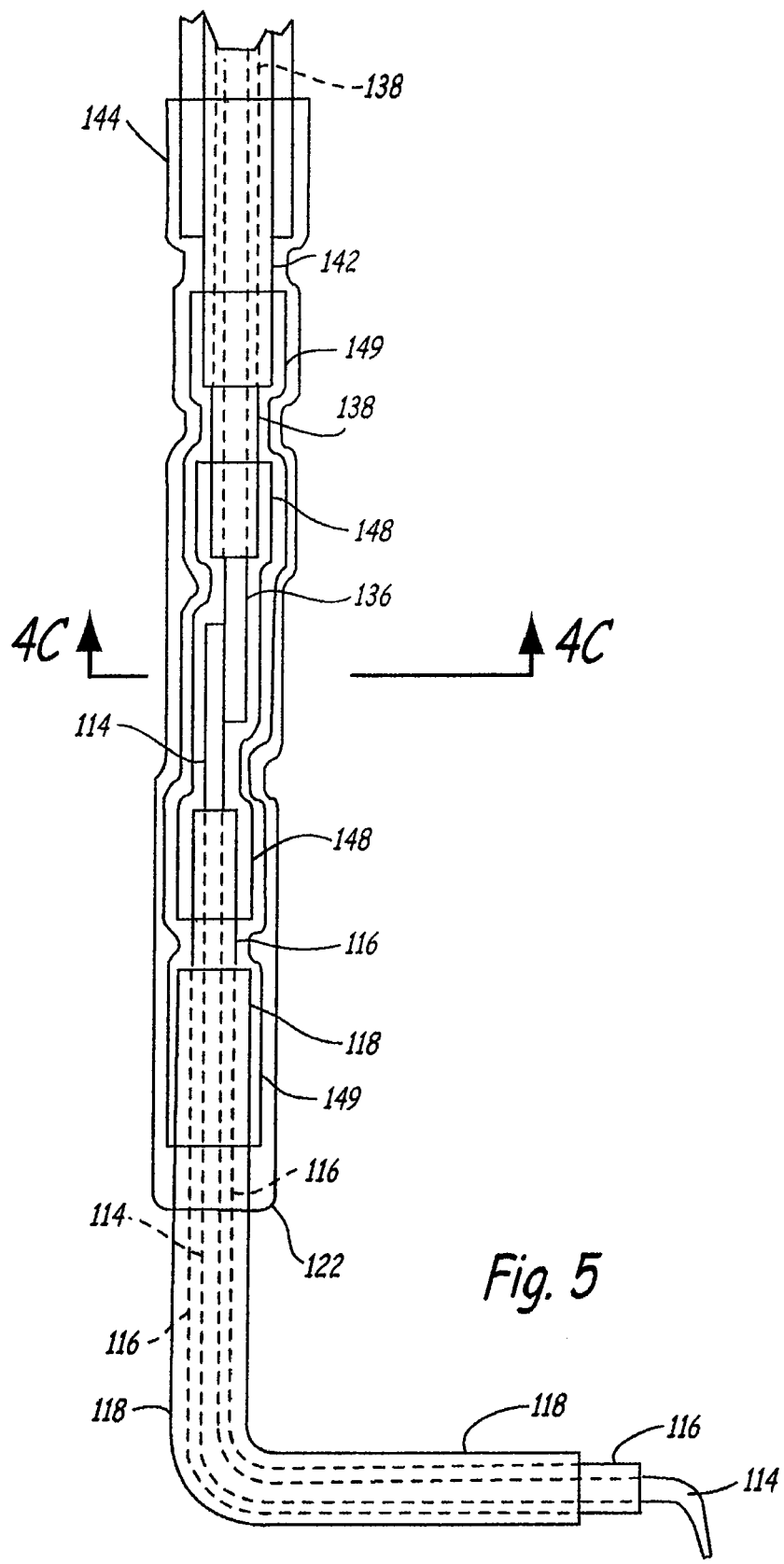

SHIELDED PROBE APPARATUS FOR PROBING SEMICONDUCTOR WAFER

CROSS-REFERENCE TO RELATED APPLICATION(S)

This is a Divisional of U.S. patent application Ser. No. 11/270,044, filed Nov. 9, 2005, now U.S. Pat. No. 7,259,577 which is a Continuation application of U.S. patent application Ser. No. 10/607,768, filed Jun. 27, 2003 now U.S. Pat. No. 6,992,495 which claims priority to U.S. patent application Ser. No. 60/392,394, filed Jun. 28, 2002, the contents of which are incorporated herein in their entirety by reference.

FIELD OF THE INVENTION

The present invention relates generally to semiconductor test equipment, and more particularly, to a shielded probe used in semiconductor test equipment for electrically probing devices on a semiconductor wafer.

BACKGROUND OF THE INVENTION

The semiconductor industry has a need to access many electronic devices on a semiconductor wafer. As the semiconductor industry grows and devices become more complex, many electrical devices, most commonly semiconductor devices, must be electrically tested, for example, for leakage currents and extremely low operating currents. These currents are often below 100 fA. In addition, the currents and device characteristics are often required to be evaluated over a wide temperature range to understand how temperature affects a device. To effectively measure at currents below 100 fA, a measurement signal must be isolated from external electrical interference, leakage currents through the dielectric material, parasitic capacitance, triboelectric noise, piezoelectric noise, and dielectric absorption, etc.

At present, semiconductor test equipment has been designed to try to prevent the above described interference or noise, etc. at a test equipment side, by driving a guard layer of a tri-axial cable at the same potential as a center signal conductor of the tri-axial cable. The outer shield of the tri-axial cable is grounded to the test equipment. It is desired that external electrical interference, leakage currents through the dielectric material, parasitic capacitance, triboelectric noise, piezoelectric noise, and dielectric absorption are significantly reduced or eliminated.

Also, because of the materials characteristics of dielectrics, it is often difficult to test characteristics of semiconductor devices in a wide operating temperature range.

Accordingly, there is a need for improved semiconductor test equipment for electrically probing semiconductor devices at low currents and over a wide temperature range.

SUMMARY OF THE INVENTION

To solve the above and the other problems, the present invention provides a shielded probe apparatus connected to semiconductor test equipment wherein the shielded probe apparatus includes a shielded probe and a tri-axial cable. The shielded probe includes a probe pin typically a metal wire made of electrochemically etched tungsten or the like. The probe pin is shielded and configured to electrically connect to the tri-axial cable for electrically probing semiconductor devices at low currents and over a wide operating temperature range.

In one embodiment, the shielded probe apparatus is capable of electrically testing a semiconductor device at a sub 100 fA operating current and an operating temperature up to 300 C.

In one embodiment, the tri-axial cable is connected to the shielded probe within a shielded chassis. The shielded probe includes a probe pin surrounded by a dielectric layer, an electrically conductive guard layer, and an optional protective dielectric layer. The tri-axial cable includes a center signal conductor surrounded by a dielectric layer, a conductive coating to reduce triboelectric effects, a conductive guard layer, a second dielectric layer, a conductive shield layer, and a protective cover. The tri-axial cable is connected to the shielded probe by electrically connecting the center signal conductor to the probe pin, such as by using high temperature to solder/braze or crimp the probe pin on the center signal conductor and in a preferred embodiment, shrink-tube, crimp, or clamp the tri-axial cable and the shielded probe to electrically connect the guard layer of the tri-axial cable to the conductive guard layer of the shielded probe. It will be appreciated that other suitable means of electrically connecting the center signal conductor and the probe pin and electrically connecting the guard layer of the tri-axial cable and the conductive guard layer of the shielded probe can be used without departing the scope of the principles of the invention.

Accordingly, the dielectric layer, the conductive guard layer, and the optional second dielectric layer of the shielded probe significantly reduce external electrical interference and allow the probe pin to test and measure small currents, such as below 100 fA. Also, the shielded probe is allowed to test the characteristics of the semiconductor devices not only in a low operating temperature but also in a high operating temperature, i.e. a wide operating temperature range by using flexible dielectric materials compatible with high temperatures. In addition, the connection between the guard layer of the tri-axial cable and the conductive guard layer of the shielded probe and the connection between the center signal conductor and the probe pin help prevent leakage currents through the dielectric materials, parasitic capacitance, piezoelectric noise, and dielectric absorption. Further, the conductive coating between the dielectric layer and the guard layer of the tri-axial cable significantly reduces and/or eliminates triboelectric noise.

These and other features and advantages of the present invention will become apparent to those skilled in the art from the following detailed description, wherein it is shown and described illustrative embodiments of the invention, including best modes contemplated for carrying out the invention. As it will be realized, the invention is capable of modifications in various obvious aspects, all without departing from the spirit and scope of the present invention. Accordingly, the drawings and detailed description are to be regarded as illustrative in nature and not restrictive.

BRIEF DESCRIPTION OF THE DRAWINGS

FIG. 3 is a schematic view of one embodiment of a shielded probe apparatus used in semiconductor test equipment, in accordance with the principles of the present invention.

FIG. 5 is a side cross-sectional view of one embodiment of the tri-axial cable connected to the shielded probe of the shielded probe apparatus, in accordance with the principles of the present invention.

DETAILED DESCRIPTION OF THE PREFERRED EMBODIMENTS

In the following description of a preferred embodiment, reference is made to the accompanying drawings, which form a part hereof, and in which is shown by way of illustration a specific embodiment in which the invention may be practiced. It is to be understood that other embodiments may be utilized and structural changes may be made without departing from the scope of the present invention.

For purposes of explanation, numerous specific details are set forth in the following description in order to provide a thorough understanding of the present invention. However, it will be evident to one of ordinary skill in the art that the present invention may be practiced without some of these specific details. In other instances, well-known structures and devices are shown in block diagram form in order to facilitate description.

The present invention utilizes the center signal conductor, guard layer, and ground of a tri-axial cable provided by semiconductor test equipment or tester to electrically isolate a probe pin enabling the low current measurements, for example, sub 100 fA measurements. The present invention also allows the tester to electrically probe devices over a wide operating temperature range, not only at a low operating temperature but also a high operating temperature, e.g. an operating temperature up to 300 C.

Figure 1:
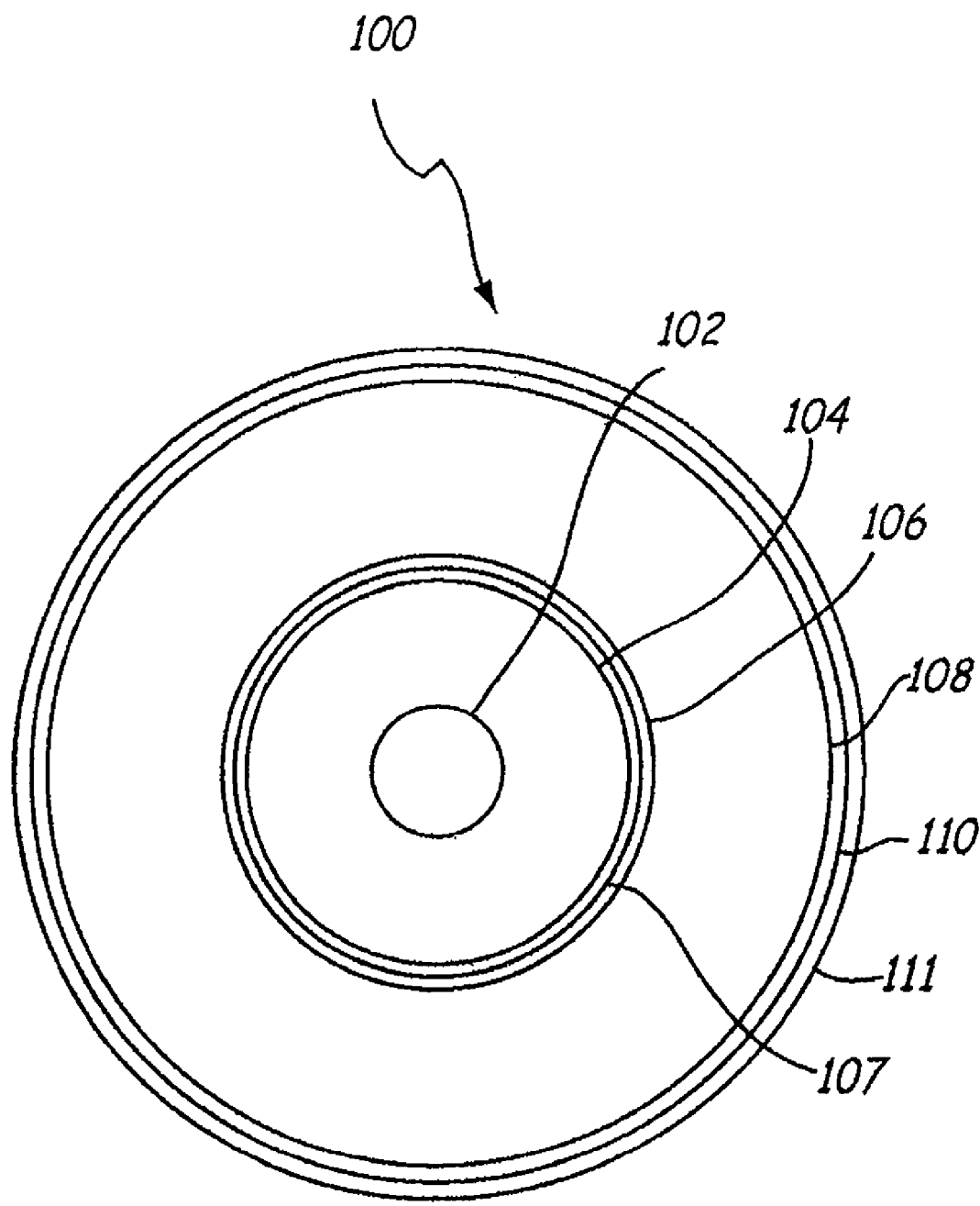
FIG. 1 is a cross-sectional view of one embodiment of a typical tri-axial cable used in semiconductor test equipment.

FIG. 1 illustrates a cross-sectional view of a typical tri-axial cable 100 with a center signal conductor 102 surrounded by a first dielectric layer 104. The first dielectric layer 104 is surrounded by a guard layer 106. The guard layer 106 is electrically conductive and is surrounded by a second dielectric layer 108. A conductive coating or dispersion layer 107 is sandwiched between the first dielectric layer 104 and the guard layer 106. The tri-axial cable 100 also includes a shield layer 110 and a protective dielectric cover layer 111 to isolate the tri-axial cable from external interference or other environmental hazard.

It will be appreciated that the term "surrounded" used herein and hereinafter is not limited to describe one layer being surrounded by another layer in its entirety. In some embodiments, one layer may be partially surrounded by another layer, whereas in other embodiments, one layer may be entirely surrounded by another layer.

Figure 2A:
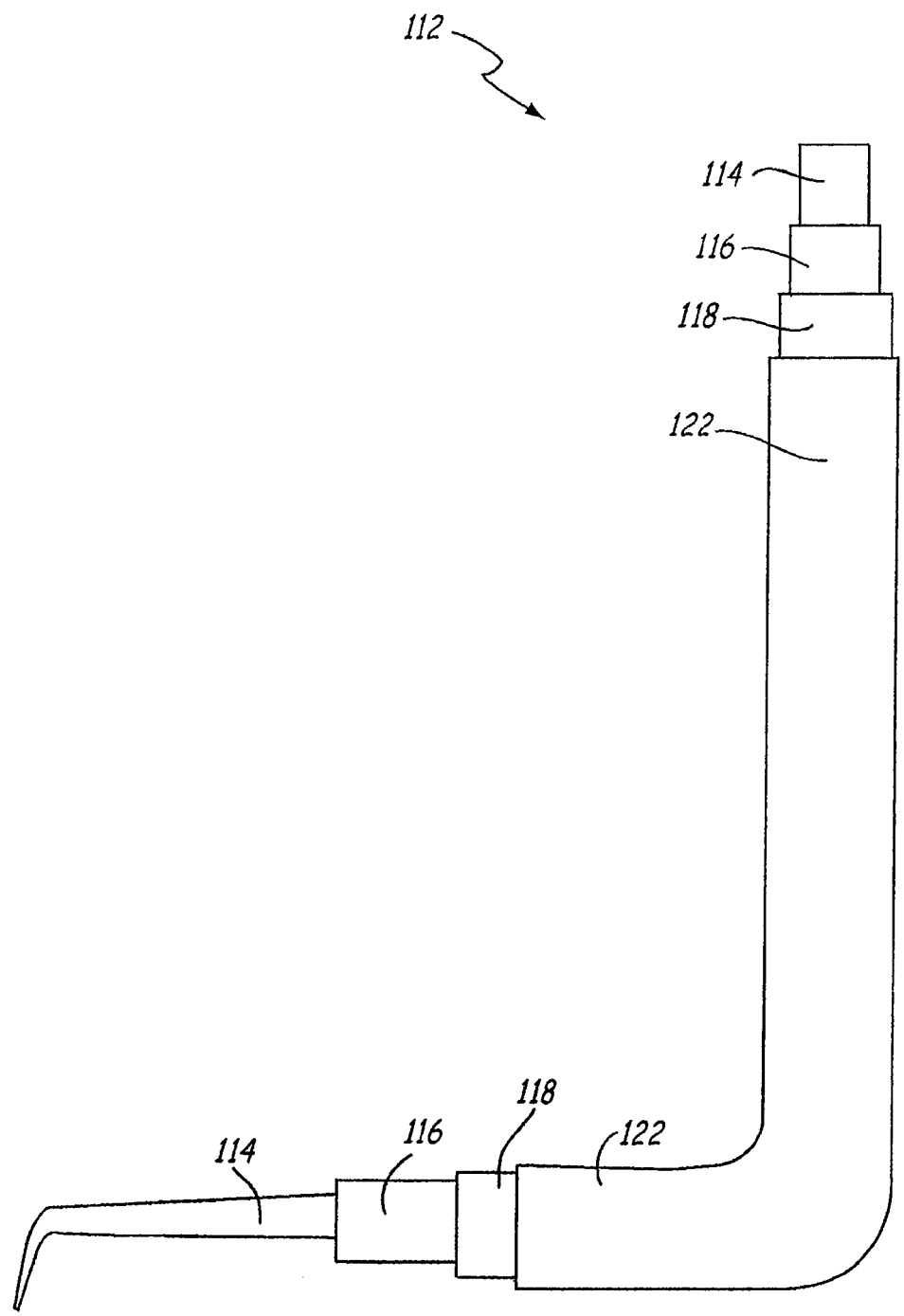
FIG. 2A is one embodiment of a shielded probe in accordance with the principles of the present invention.
Figure 2B:
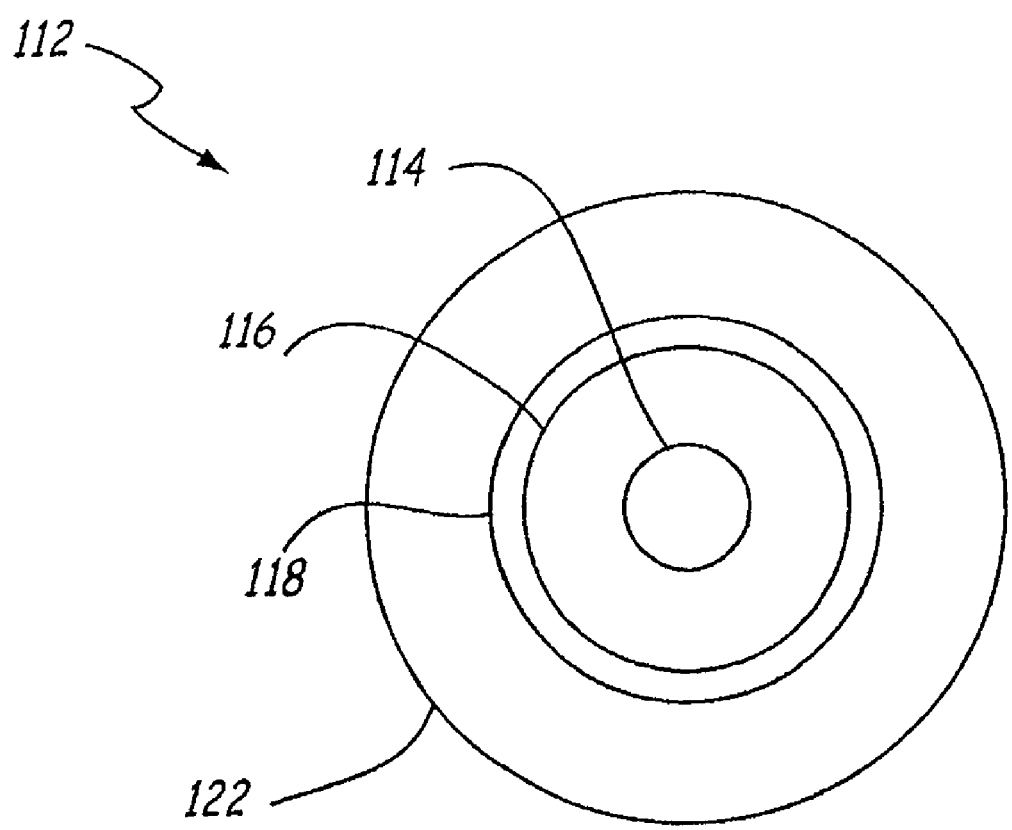
FIG. 2B is a cross-sectional view of one embodiment of the shielded probe, as shown in FIG. 2A, in accordance with the principles of the present invention.

FIGS. 2A and 2B illustrate a shielded probe 112 which includes a probe pin 114. The configuration of the probe pin 114 can be varied, a couple of which are disclosed in a pending utility patent application, Ser. No. 09/730,130, filed on Dec. 4, 2000, which is a Continuation-In-Part (CIP) patent application of Ser. No. 09/021,631, filed on Feb. 10, 1998, which are incorporated herewith by references.

The probe pin 114 is surrounded by a first dielectric layer 116 preferably made of a thin, flexible high temperature dielectric material, such as poly (tetrafluoro-p-xylylene), a class of polymers known as parylene. The first dielectric layer 116 is preferably coated on the probe pin by a physical or chemical-vapor deposit (PVD or CVD) method. It will be appreciated that other suitable flexible high temperature dielectric materials, such as epoxies, or other suitable coating methods can be used within the scope of the present invention.

The probe pin 114 with the dielectric layer 116 is preferably sputter-coated with an electrically conductive guard layer 118. The conductive guard layer 118 is preferably made of gold. It will be appreciated that other suitable conductive coating materials and coating methods can be used without departing from the scope of the present invention.

A second dielectric layer 122 may be provided outside of the conductive guard layer 118. The second dielectric layer 122 is an optional protective coating which provides protection layer for the conductive guard layer 118. The second dielectric layer 122 is preferably made of a thin, flexible high temperature dielectric material, such as polyamide. It will be appreciated that other suitable flexible high temperature dielectric materials can be used within the scope of the present invention.

As shown in FIG. 3, a shielded probe apparatus 124, in accordance with the principles of the present invention, includes an electrically shielded chassis 126 and a ceramic assembly 128 for electrically probing semiconductor devices (not shown). A tri-axial cable 130 of semiconductor test equipment is inserted into the shielded chassis 126 at one end 132 and connected to the shielded probe 112 at the other end 134.

Figure 4A:
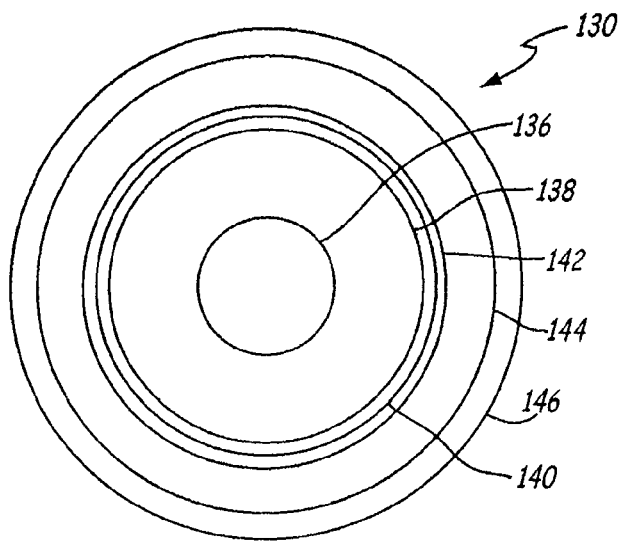
FIG. 4A is a cross-sectional view of one embodiment of a tri-axial cable of the shielded probe apparatus, along line 4A-4A in FIG. 3, in accordance with the principles of the present invention.

As shown in FIG. 4A, the tri-axial cable 130 includes a center signal conductor 136 on which testing signals are carried from the test equipment to the shielded probe 112. The center signal conductor 136 is surrounded by a first dielectric layer 138 preferably made of high temperature PTFE (Teflon). The first dielectric layer 138 is surrounded by an electrically conductive coating or dispersion layer 140. The conductive coating or dispersion layer 140 is sandwiched between the first dielectric layer 138 and an electrically conductive guard layer 142 to reduce triboelectric effects. In a testing operation, the guard layer 142 is driven at the same potential as the center signal conductor 136 such that the capacitance between the guard layer 142 and the center signal conductor 136 is eliminated. Accordingly, the parasitic capacitance is eliminated, and current leakage is prevented.

An optional second dielectric layer 144 may be provided outside of the guard layer 142. A shield 146 and a protective dielectric cover (not shown) are provided outside of the guard layer 142 and/or the optional second dielectric layer 144 to isolate the tri-axial cable 130 from external interference.

Figure 4B:
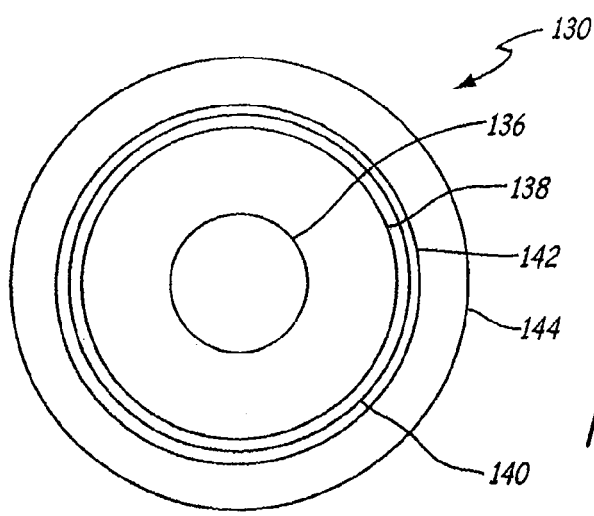
FIG. 4B is a cross-sectional view of one embodiment of the tri-axial cable of the shielded probe apparatus, along line 4B-4B in FIG. 3, in accordance with the principles of the present invention.

As shown in FIG. 3, the tri-axial cable 130 is inserted into the chassis 126 where the shield 146 and the protective dielectric cover (not shown) of the tri-axial cable 130 are stripped away and electrically connected to the ground. FIG. 4B illustrates a cross-sectional view of the cable 130 along line 4B-4B in FIG. 3. The optional second dielectric layer 144 may extend to the shielded probe 112 or terminate at the chassis' sidewalls.

Figure 4C:
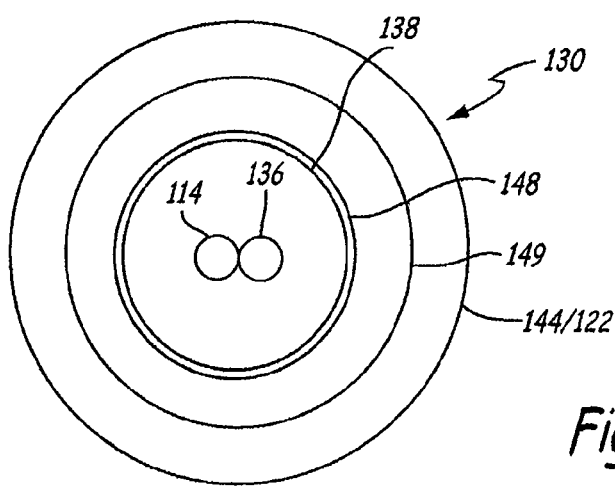
FIG. 4C is a cross-sectional view of one embodiment of the tri-axial cable connected to the shielded probe of the shielded probe apparatus, along line 4C-4C in FIG. 3, in accordance with the principles of the present invention.

FIG. 4C illustrates a cross-sectional view (along line 4C-4C in FIG. 3) where the tri-axial cable 130 is connected to the shielded probe 112. FIG. 5 illustrates a side cross-sectional view of one embodiment of the tri-axial cable 130 connected to the shielded probe 112 of the shielded probe apparatus 124. The tri-axial cable 130 is attached to the shielded probe 112, preferably by using high temperature to solder/braze or crimp the probe pin 114 on the center signal conductor 136, and shrink-tube, crimp, or clamp the tri-axial cable 130 and the shielded probe 112 into a shrink tube layer 148 to electrically connect the probe pin 114 to the center signal conductor 136. A second shrink tube layer 149 electrically connects the guard layer 142 of the tri-axial cable 130 to the conductive guard layer 118 of the shielded probe 112. It will be appreciated that other suitable means of electrically connecting the center signal conductor and the probe pin and electrically connecting the guard layer of the tri-axial cable and the conductive guard layer of the shielded probe can be used without departing the scope of the principles of the invention.

In one embodiment, the optional second dielectric layer 144 of the tri-axial cable 130 and/or the optional second dielectric layer 122 of the shielded probe may be shrink-tubed by folding back and over (not shown) the tri-axial cable 130 and the shielded probe 112, respectively, so as to help retain the physical connection between the shielded probe 112 and the tri-axial cable 130.

Further referring to FIG. 3, a probing end of the shielded probe 112 is inserted into a hole and a slot of the high temperature ceramic assembly 128 or other suitable high temperature-resistant material, as described in the pending utility patent application, Ser. No. 09/730,130, filed on Dec. 4, 2000, which is a Continuation-In-Part (CIP) patent application of Ser. No. 09/021,631, filed on Feb. 10, 1998, which are incorporated herewith by references.

Further in one embodiment, the probe pin 114 is made of electrochemically etched tungsten or other suitable materials. The diameter of the probe pin 114 is preferably in a range of 0.1 mm to 0.25 mm. It will be appreciated that the materials, diameter, and configuration of the probe pin 114 can be varied without departing from the principles of the present invention.

From the above description and drawings, it will be understood by those of ordinary skill in the art that the particular embodiments shown and described are for purposes of illustration only and are not intended to limit the scope of the present invention. Those of ordinary skill in the art will recognize that the present invention may be embodied in other specific forms without departing from its spirit or essential characteristics. References to details of particular embodiments are not intended to limit the scope of the invention.

What is claimed is:

1. A shielded probe apparatus, capable of electrically testing a semiconductor device at a sub 100 fA operating current and an operating temperature up to 300 C., comprising a shielded probe and a tri-axial cable that are electrically connected within a shielded chassis, wherein the shielded probe comprises:
   a probe pin;
   a first dielectric layer, the probe pin being surrounded by the first dielectric layer;
   a conductive guard layer, the first dielectric layer being surrounded by the conductive guard layer; and
   a second dielectric layer, the conductive guard layer being surrounded by the second dielectric layer.

2. The apparatus of 1, wherein the tri-axial cable comprises:
   a center signal conductor;
   a first dielectric layer, the center signal conductor being surrounded by the first dielectric layer;
   a conductive layer, the dielectric layer being surrounded by the conductive layer;
   a guard layer, the conductive layer being surrounded by the guard layer;
   a second dielectric layer, the guard layer being surrounded by the second dielectric layer;
   a shield, the second dielectric layer being surrounded by the shield; and
   a protective cover, the shield being surrounded by the protective cover.

3. The apparatus of claim 2, wherein the probe pin and the center signal conductor are electrically connected to each other.

4. The apparatus of claim 3, wherein the probe pin is electrically connected to the center signal conductor.

5. The apparatus of claim 3, further comprising a shrink tube to shrink-tube the probe pin and the center signal conductor.

6. The apparatus of claim 2, wherein the conductive guard layer of the shielded probe and the guard layer of the tri-axial cable are electrically connected to each other.

7. The apparatus of claim 6, further comprising a second shrink tube to shrink-tube the conductive guard layer and the guard layer.

8. The apparatus of claim 2, wherein the guard layer of the tri-axial cable is driven to the same potential as the center signal conductor, and the shield of the tri-axial cable is grounded to the shielded chassis.

9. A shielded probe apparatus, capable of electrically testing a semiconductor device at a sub 100 fA operating current and an operating temperature up to 300 C., comprising a shielded probe and a tri-axial cable that are electrically connected within a shielded chassis,
   wherein the shielded probe comprises:
      a probe pin;
      a dielectric layer, the probe pin being surrounded by the dielectric layer;
      a conductive guard layer, the dielectric layer being surrounded by the conductive guard layer;
   wherein the tri-axial cable comprises:
      a center signal conductor;
      a first dielectric layer, the center signal conductor being surrounded by the first dielectric layer;
      a conductive layer, the dielectric layer being surrounded by the conductive layer;
      a guard layer, the conductive layer being surrounded by the guard layer;
      a second dielectric layer, the guard layer being surrounded by the second dielectric layer;
      a shield, the second dielectric layer being surrounded by the shield; and
      a protective cover, the shield being surrounded by the protective cover; and
   wherein the conductive guard layer of the shielded probe and the guard layer of the tri-axial cable are electrically connected to each other.

10. The apparatus of claim 9, further comprising a second shrink tube to shrink-tube the conductive guard layer and the guard layer.

11. The apparatus of claim 9, wherein the guard layer of the tri-axial cable is driven to the same potential as the center signal conductor, and the shield of the tri-axial cable is grounded to the shielded chassis.

* * * * *